(12) United States Patent
Ogawa

(10) Patent No.: US 7,663,929 B2
(45) Date of Patent: Feb. 16, 2010

(54) SEMICONDUCTOR MEMORY DEVICE

(75) Inventor: Mikio Ogawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/188,565

(22) Filed: Aug. 8, 2008

(65) Prior Publication Data

US 2009/0040834 A1 Feb. 12, 2009

(30) Foreign Application Priority Data

Aug. 10, 2007 (JP) ............................. 2007-208720

(51) Int. Cl.
*G11C 11/34* (2006.01)
(52) U.S. Cl. .............................. 365/185.21; 365/185.25
(58) Field of Classification Search ............ 365/185.21, 365/185.25, 185.17
See application file for complete search history.

(56) References Cited

U.S. PATENT DOCUMENTS

| | | | |
|---|---|---|---|
| 5,909,398 A * | 6/1999 | Tanzawa et al. ......... 365/185.29 |
| 6,058,044 A | 5/2000 | Sugiura et al. |
| 6,081,456 A * | 6/2000 | Dadashev .............. 365/185.23 |
| 6,157,570 A * | 12/2000 | Nachumovsky ........ 365/185.18 |
| 6,621,738 B2 * | 9/2003 | Tanaka et al. .......... 365/185.18 |
| 7,259,992 B2 | 8/2007 | Shirota |
| 2006/0034140 A1 | 2/2006 | Ogawa et al. |
| 2007/0014182 A1 | 1/2007 | Shuto |
| 2008/0158957 A1 | 7/2008 | Ogawa et al. |

* cited by examiner

*Primary Examiner*—Anh Phung
(74) *Attorney, Agent, or Firm*—Oblon, Spivak, McClelland, Maier & Neustadt, L.L.P.

(57) ABSTRACT

A memory cell array forms a plurality of control areas in a direction orthogonal to the direction of extension of a bit line. A sense amplifier initially charges a bit line in each control area in the memory cell array with a charging voltage controlled by a respective individual bit-line control signal. Bit-line control signal generator circuits are provided plural in accordance with the control areas in the memory cell array. Each bit-line control signal generator circuit receives the potential on a cell source line in a corresponding control area, individually generates and provides the bit-line control signal in the each control area in accordance with the received voltage on the cell source line in each control area.

20 Claims, 5 Drawing Sheets

SEMICONDUCTOR MEMORY DEVICE

CROSS-REFERENCE TO RELATED APPLICATION

This application is based upon and claims the benefit of priority from the prior Japanese Patent Application No. 2007-208720, filed on Aug. 10, 2007, the entire contents of which are incorporated herein by reference.

BACKGROUND OF THE INVENTION

1. Field of the Invention

The present invention relates to a semiconductor memory device such as EEPROMs of the NAND-cell, NOR-cell, DINOR (Divided bit line NOR)-cell and AND-cell types, and more particularly to a semiconductor memory device having an improved sense amplifier of the current sense type.

2. Description of the Related Art

A sense amplifier in a semiconductor memory device such as a flash memory basically senses the presence/absence or the level of cell current flowing in accordance with data in a memory cell, thereby deciding the value of data. The sense amplifier is usually connected to a bit line (data line) to which a number of memory cells are connected. The sensing scheme is roughly divided into the voltage sense type and the current sense type.

A sense amplifier of the current sense type precharges a bit line isolated from the memory cells to a certain voltage, discharges the bit line through the selected memory cell, and detects the discharged state of the bit line at a sense node connected to the bit line. At the time of data sensing, the bit line is isolated from the current source load to detect the bit line voltage determined from cell data.

A sense amplifier of the voltage sense type, on the other hand, supplies read current flowing in a memory cell via the bit line, thereby sensing data. Also in this case, cell data determines the bit line voltage, and eventually data determination at the sense node connected to the bit line detects a difference in voltage at the sense node based on the difference in cell current.

The sense amplifier of the current sense type and the sense amplifier of the voltage sense type have the following advantages and disadvantages in general. The voltage sense type utilizes charging and discharging bit lines and accordingly has less power consumption. In a mass storage memory with a large bit line capacity, though, charging/discharging is time-consuming and accordingly fast sensing becomes difficult. In addition, the amplitude of the bit line voltage is made relatively large in accordance with cell data and accordingly a noise between adjacent bit lines causes a problem.

In contrast, the sense amplifier of the current sense type senses data while supplying read current flowing in the memory cell via the bit line, thereby enabling fast sensing. In addition, a clamp transistor (presense amplifier) arranged between the bit line and the sense node is used to reduce the amplitude of the bit line voltage in accordance with cell data and accordingly the noise between bit lines hardly causes a problem. Also in this case, however, reading is executed on alternate bit lines, and other bit lines not subjected to reading are grounded and used as shields to exclude influences between bit lines on reading.

To the contrary, the bit line potential may be controlled such that it is always fixed at a constant voltage to exclude influences between bit lines and allow all bit lines to be sensed in parallel on sensing. Such a sense amplifier of the ABL (All Bit Line) type has been proposed (JP 2006-500729T, paragraphs 0062-0068, 0076-0079, FIGS. 7A, 7B, 8 and 13).

In such the sense amplifier of the current sense type, however, advanced fine patterning of devices increases the value of current flowing in the cell source line and elevates the potential on the cell source line as a problem. The elevation of the potential on the cell source line decreases the potential difference between the bit line controlled at a certain potential by a clamp transistor and the cell source line. Accordingly, the drain-source voltage Vds in the selected cell lowers and the gate-source voltage Vds in the selected cell also lowers. As a result, the cell current decreases and causes a failure in reading data out of the selected cell.

To prevent such the read failure, there has been proposed a method called multipath sense, which comprises multiple times of sensing (Patent Document 1). The multipath sense is a method comprising turning off the selected cell after once sense current flows therein at the first sensing, followed by sensing again. Thus, the value of current flowing in the cell source line is suppressed lower than the first sensing and the subsequent sensing can correctly detect the sense current flowing in the selected cell that could not be detected in the previous sensing.

The multipath sense, however, requires multiple times of sensing and accordingly consumes time in sensing as a problem. In particular, storing multivalue data such as 8-value or 16-value data in a memory cell increases times of sensing to 7 or 15. Accordingly, the requirement of multiple times of sensing in a single threshold decision causes a fatal drawback with respect to the reading time.

On the other hand, a control may be considered to elevate the gate voltage on the bit-line clamp transistor in accordance with the elevation of the potential on the cell source line. In this case, however, the potential on the cell source line differs from part to part in the memory cell array. Accordingly, the voltage control of bit lines together causes an excessively controlled bit line and a less controlled bit line as a problem.

SUMMARY OF THE INVENTION

In one aspect the present invention provides a semiconductor memory device, comprising: a memory cell array having plural memory cells connected between a bit line and a cell source line; a sense amplifier of the current sense type operative to initially charge the bit line with a charging voltage controlled by a bit-line control signal and detect the value of current flowing in the bit line when a certain gate voltage is given to a data read-targeted memory cell to decide data read out of the memory cell; and a bit-line control signal generator circuit operative to receive the voltage on the cell source line, generate the bit-line control signal in accordance with the received voltage on the cell source line and provide it to the sense amplifier, wherein the memory cell array forms a plurality of control areas in a direction orthogonal to the direction of extension of the bit line, wherein the sense amplifier initially charges a bit line in each control area in the memory cell array with a charging voltage controlled by a respective individual bit-line control signal, wherein the bit-line control signal generator circuit is one of plural bit-line control signal generator circuits provided in accordance with the control areas in the memory cell array, wherein each bit-line control signal generator circuit receives the potential on the cell source line in a corresponding control area, individually generates and provides the bit-line control signal in the each control area in accordance with the received voltage on the cell source line in each control area.

In one aspect the present invention provides a semiconductor memory device, comprising: a memory cell array having plural memory cells connected between a bit line and a cell source line; a sense amplifier of the current sense type operative to initially charge the bit line with a charging voltage controlled by a bit-line control signal and detect the value of current flowing in the bit line when a certain gate voltage is given to a data read-targeted memory cell to decide data read out of the memory cell; and a bit-line control signal generator circuit operative to receive the voltage on the cell source line, generate the bit-line control signal in accordance with the received voltage on the cell source line and provide it to the sense amplifier, wherein the memory cell array and the sense amplifier are divided into M areas (M is an integer of 3 or more), wherein the bit-line control signal generator circuit receives the voltage on the cell source line in each of the M areas of the memory cells, generates the bit-line control signal in accordance with the received voltage on the cell source line in each area, and supplies the generated bit-line control signal to the sense amplifier in each area.

DETAILED DESCRIPTION OF THE EMBODIMENTS

The embodiments of the invention will now be described with reference to the drawings.

Figure 1:
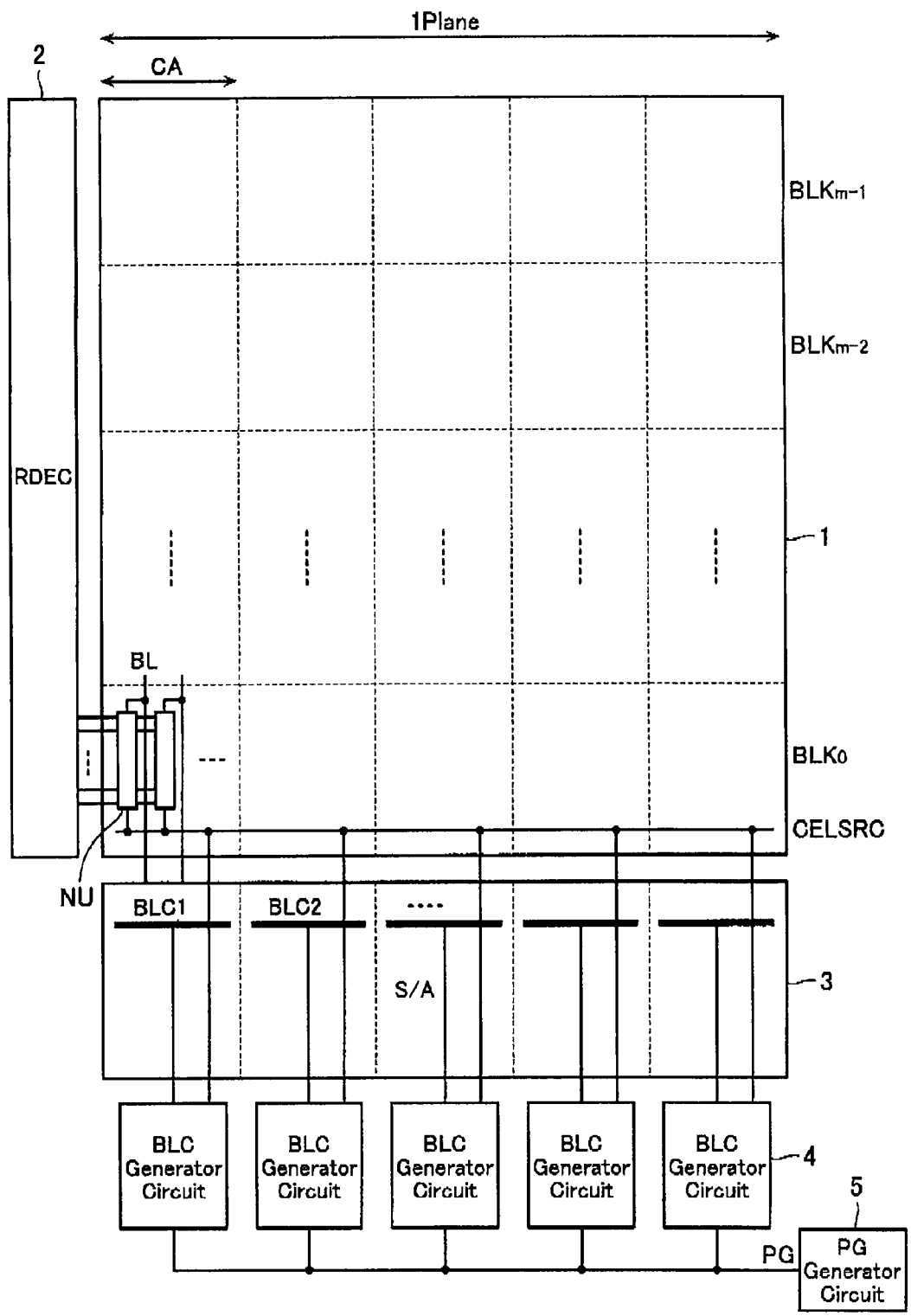
FIG. 1 is a block diagram of the major part of a NAND-type flash memory according to one embodiment of the present invention.

FIG. 1 is a block diagram showing the major part of a semiconductor memory device according to one embodiment of the present invention. This semiconductor memory device is a NAND-type flash memory, which comprises: a memory cell array 1; a row decoder 2 operative to select a word line and a selection gate line in the memory cell array 1; a sense amplifier 3 provided atone end or both ends in a bit line BL (described later) direction in the memory cell array 1 and operative to read data via the bit line BL; a plurality of BLC (bit-line control signal) generator circuits 4 provided in parallel with the sense amplifier 3; and a PG generator circuit 5 operative to supply a control signal PG to the BLC generator circuits 4.

Figure 2:
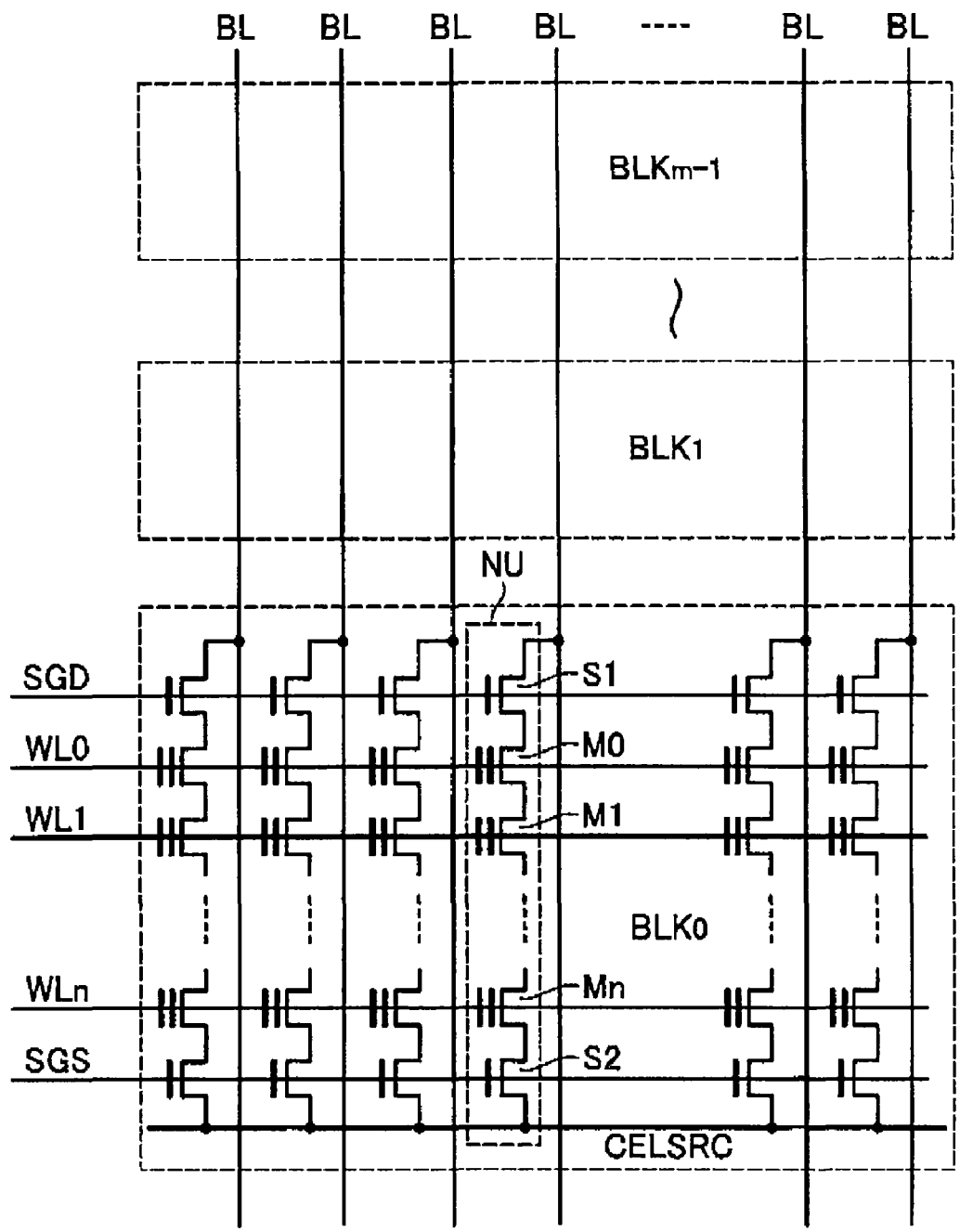
FIG. 2 is a circuit diagram of a memory cell array in the same memory.

The memory cell array 1 comprises a plurality of NAND cell units NU arrayed in matrix as shown in FIG. 2. A NAND cell unit NU includes: a memory cell string of plural memory cells M1-Mn serially connected in such a manner that adjacent ones share a source/drain diffused layer; a selection gate transistor S1 connected between one end of the memory cell string and the bit line BL; and a selection gate transistor S2 connected between the other end of the memory cell string and a cell source line CELSRC. Control gates of the memory cells M0 to Mm-1 are connected in such a manner that control gates of memory cells arrayed in the lateral direction are connected in common to form word lines WL0-WLn. Control gates of the selection gate transistors S1, S2 are connected in such a manner that control gates of selection gate transistors arrayed in the lateral direction are connected in common to form selection gate lines SGD, SGS.

A set of NAND cell units NU arrayed in the word line WL direction configures a block or the minimum unit of data erase and plural such blocks BLK0-BLKm-1 are arranged in the bit line direction. The memory cell array 1 is divided into plural areas in the direction of extension of the word line WL to form plural control areas CA.

Figure 3:
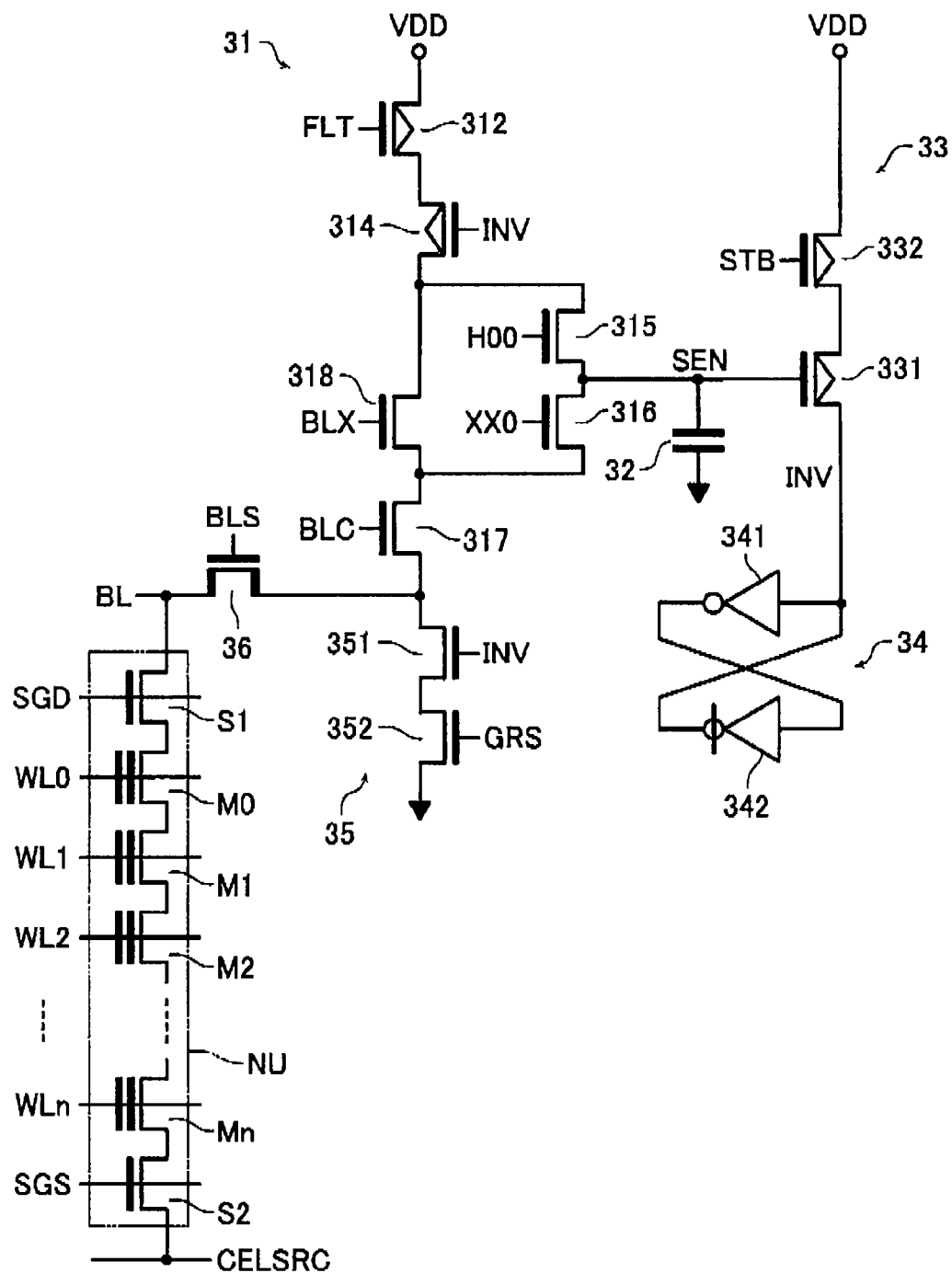
FIG. 3 is a circuit diagram of a sense amplifier in the same memory.

The sense amplifier 3 may be configured as shown in FIG. 3. In this case, a sense amplifier of the ABL type is described below by way of example though the present invention is not particularly limited to the sense amplifier of this type.

The sense amplifier 3 mainly includes: an initial charging circuit 31 capable of initially charging the bit line BL and a sense node SEN: a sensing capacitor 32 connected to the sense node SEN; a current discriminating circuit 33 operative to detect the value of current flowing in the bit line BL based on the potential on the sense node SEN; a latch 34 operative to hold an output from the current discriminating circuit 33 as read data; a discharging circuit 35 operative to discharge the charge stored on the bit line BL and the sense node SEN; and a bit line selection transistor 36 operative to selectively connect the sense amplifier 3 with the bit line BL.

The initial charging circuit 31 includes a charge switch PMOS transistor 312 connected to the power source VDD to switch on/off the charging current. The source of the PMOS transistor 312 is directly connected to the power source VDD. A PMOS transistor 314 and an NMOS transistor 315 are serially connected between the drain of the PMOS transistor 312 and the sense node SEN. A serial circuit of an NMOS transistor 316 and an NMOS transistor 317 for voltage clamp is interposed between the sense node SEN and the bit line selection transistor 36. An NMOS transistor 318 is connected in parallel with the serial circuit of the NMOS transistors 315, 316. Namely, the NMOS transistor 315 supplies initial charging current to the sense node SEN. The NMOS transistor 316 supplies current from the sense node SEN to the bit line BL. The NMOS transistor 318 continuously supplies current to the bit line BL not via the sense node SEN. The NMOS transistor 317 is connected between the NMOS transistors 316, 318 and the bit line BL and used in voltage clamping. The NMOS transistors 315, 316, 318 switch the charging/discharging paths to the bit line BL and the sense node SEN. When the current discriminating circuit 33 detects the potential on the sense node SEN, the NMOS transistor 315 is turned "off" and the NMOS transistor 318 is turned "on".

The current discriminating circuit 33 includes a PMOS transistor 331 for detecting the sense node SEN, and a PMOS transistor 332 connected between the source of the transistor 331 and the power source VDD and operative at latch timing. Connected to the drain of the PMOS transistor 331 is the latch 34, which includes CMOS inverters 341, 342 connected in antiparallel. The latch 34 has an output linked to a read bus, not shown. The discharging circuit 35 includes a serial circuit of NMOS transistors 351, 352.

Figure 4:
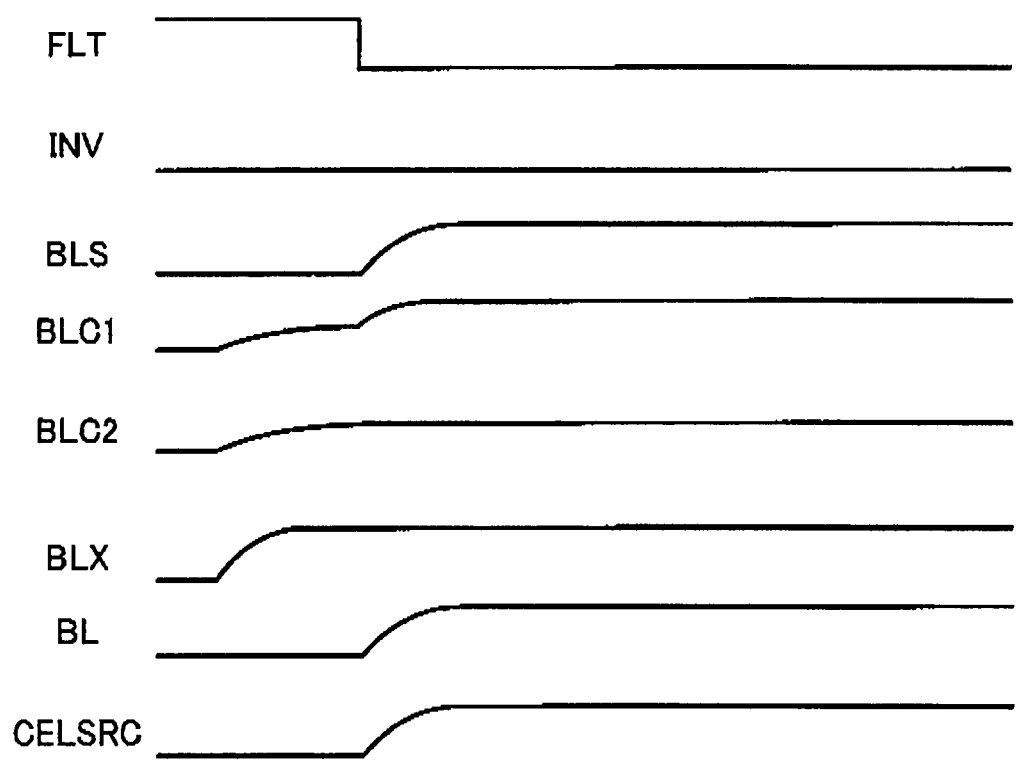
FIG. 4 is a waveform diagram showing operation of the sense amplifier in the same memory.

The sense amplifier 3 has operation periods of precharge, sense, data latch and discharge. FIG. 4 is a timing chart during a precharge period. To start precharging, first, a control signal INV supplied to the gate of the PMOS transistor 314 is at the low level, and control signals H00, XX0 supplied to the gates of the NMOS transistors 315, 316 are at the high level (not shown). In this situation, control signals BLC, BLX supplied to the gates of the NMOS transistors 317, 318 rise to a certain voltage that can transfer the power source VDD to the bit line BL. Subsequently, a control signal BLS supplied to the gate of the bit line selection transistor 36 rises and a control signal BLT fed to the gate of the PMOS transistor 312 falls. As a result, the transistors 312, 314, 315-318 and 36 turn on and allow charging current to flow in the bit line BL and the sense node SEN via two paths of the transistors 315, 316 and the transistor 318.

If the selected cell stores "0" data in the NAND cell unit NU connected to the bit line BL, no on-current flows in the NAND cell unit NU. Therefore, the potential on the bit line BL becomes $V_{BLC}$–Vth, which is equal to the voltage $V_{BLC}$ of the bit-line control signal BLC supplied to the gate of the voltage clamp transistor 317 minus the threshold Vth of the transistor 317. If the selected cell stores "1" data (erased), a certain current flows in the selected cell and the potential on the bit line BL becomes lower than that when the selected cell stores "0" data.

After completion of the precharge period, the transistor 315 is turned off and the charge stored on the sense node SEN is discharged via the bit line BL and the selected cell if the selected cell holds data "1". Subsequently, the value of current flowing in the bit line BL via the transistor 318 is controlled. As a result, the bit line BL is kept always at a constant potential to exclude influences to adjacent bit lines. Thereafter, the potential on the sense node SEN is sensed to decide data stored in the selected cell. The decided data is latched in the latch 34 and provided to external via the data line. Subsequently, the charge on the bit line BL and the sense node SEN is discharged via the discharging circuit 35.

During the precharge period and on sensing, the current flowing in the bit line BL flows into the cell source line CELSRC in a stroke, thereby elevating the potential on the cell source line CELSRC. Therefore, the BLC generator circuit 4 cooperates with the PG generator circuit 5 to generate the bit-line control signal BLC of the voltage in accordance with the voltage on the cell source line CELSRC and supplies it to the gate of the clamp transistor 317 in the sense amplifier 3. Namely, in accordance with the elevation of the voltage on the cell source line CELSRC, the voltage of the control signal BLC is also allowed to rise.

In this embodiment, monitor positions on the cell source line CELSRC are arranged one by one in the control areas CA of the memory cell array 1 and each BLC generator circuit 4 individually controls the bit-line control signal BLC in each control area CA. Namely, the current flowing in the bit line BL elevates the voltage on the cell source line CELSRC as shown in FIG. 4. Accordingly, the cell source voltage is observed individually in each control area CA and, based on this result, the bit-line control signals BLC1, BLC2, . . . are controlled individually.

Figure 5:
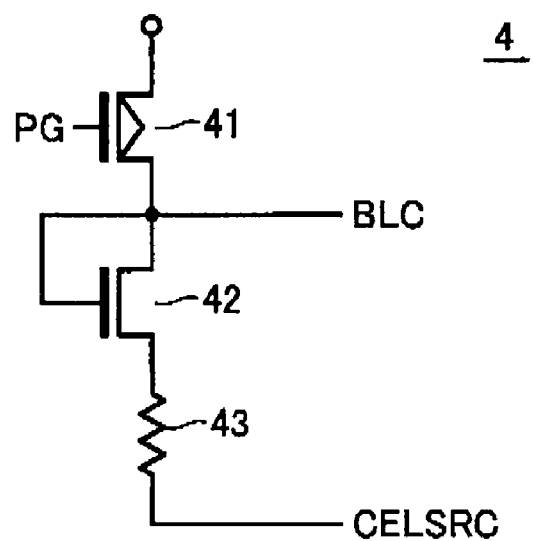
FIG. 5 is a circuit diagram of a BLC generator circuit in the same memory.
Figure 6:
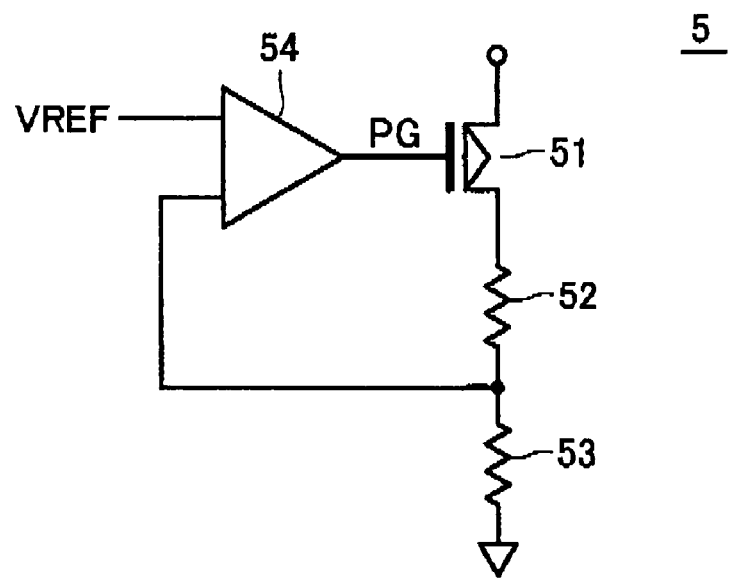
FIG. 6 is a circuit diagram of a PG generator circuit in the same memory.

FIG. 5 shows a specific configuration example of the BLC generator circuit 4, and FIG. 6 shows a specific configuration example of the PG generator circuit 5. The PG generator circuit 5 comprises a constant current circuit, which includes a serial circuit of a PMOS transistor 51 and resistors 52, 53, and an operational amplifier 54 operative to supply the control signal PG to the gate of the PMOS transistor 51 to control the transistor 51 such that the voltage drop across the resistor 53 caused by the current flowing in the serial circuit meets the reference voltage VREF. The BLC generator circuit 4 comprises a serial circuit of a PMOS transistor 41, a diode-connected NMOS transistor 42, and a resistor 43. The PMOS transistor 41 has a gate given the control signal PG to supply a constant current flowing in the resistor 43 and the resistor 43 has one end connected to the cell source line CELSRC. It is configured such that as the voltage on the cell source line CELSRC rises or falls, the potential on the point of connection between the PMOS transistor 41 and the NMOS transistor 42 also rises or falls. The point of connection between the transistors 41, 42 is used as the output of the bit-line control signal BLC.

The BLC generator circuit 4 is configured in other words as follows. Namely, the NMOS transistor 42 and the resistor 43 serve as a resistor element, which has one end supplied with the voltage on the cell source line CELSRC and the other end used as the output terminal of the bit-line control signal BLC. The PMOS transistor 41 supplies a constant current in the NMOS transistor 42 and the resistor 43 (resistor element).

The PG generator circuit 5 is configured in other words as follows. Namely, the PG generator circuit 5 supplies the control signal PG for constant current to the gate of the PMOS transistor 41. The PG generator circuit 5 supplies the control signal PG to the BLC generator circuits 4 in common. In the PG generator circuit 5, the PMOS transistor 51, the resistors 52, 53, and the operational amplifier 54 configure a current mirror paired with the PMOS transistor 41 in the BLC generator circuit 4.

In this embodiment, the BLC generator circuit 4 is provided in each control area CA in the memory cell array 1, and the bit-line control signal BLC is generated individually for each control area CA to control the voltage on the bit line BL generated by the sense amplifier 3. Accordingly, it is possible to prevent the fluctuation of the cell source line CELSRC from causing a read error in each control area CA. In addition, this embodiment makes it possible to read all data by single sensing, which can reduce the read time greatly over the multipath method.

Desirably, the number of the control areas CA formed through division of the memory cell array 1 is equal to 3 or more. The number of the BLC generator circuits 4 is preferably equal to 3 or more though it is not required to meet the number of the control areas CA. The BLC generator circuit 4 may be one that can control one or more control areas CA.

The BLC generator circuits 4 are arranged at one end or both ends of the memory cell array 1 in the direction of extension of the bit line BL as is preferable from the viewpoint of layout.

The above embodiments describe the NAND-type flash memory by way of example. The present invention is though not limited to the NAND-type flash memory but rather can be applied to semiconductor memory devices such as EEPROMs of the NOR type, the DINOR (Divided bit line NOR) type and the AND type as well.

What is claimed is:

1. A semiconductor memory device, comprising:
a memory cell array having plural memory cells connected between a bit line and a cell source line;
a sense amplifier of the current sense type operative to initially charge said bit line with a charging voltage controlled by a bit-line control signal and detect the value of current flowing in said bit line when a certain gate voltage is given to a data read-targeted memory cell to decide data read out of said memory cell; and
a bit-line control signal generator circuit operative to receive the voltage on said cell source line, generate said bit-line control signal in accordance with the received voltage on said cell source line and provide it to said sense amplifier,
wherein said memory cell array forms a plurality of control areas in a direction orthogonal to the direction of extension of said bit line,
wherein said sense amplifier initially charges a bit line in each control area in said memory cell array with a charging voltage controlled by a respective individual bit-line control signal, wherein said bit-line control signal generator circuit is one of plural bit-line control signal generator circuits provided in accordance with said control areas in said memory cell array, wherein each bit-line control signal generator circuit receives the potential on said cell source line in a corresponding control area, individually generates and provides said bit-line control signal in said each control area in accordance with the received voltage on said cell source line in each control area.

2. The semiconductor memory device according to claim 1, wherein said memory cell array forms M control areas (M is an integer of 3 or more),
wherein said bit-line control signal generator circuit is one of such bit-line control signal generator circuits provided N (N is an integer of 3 or more) to control one or more of said M control areas.

3. The semiconductor memory device according to claim 2, wherein said each bit-line control signal generator circuit is arranged at a position adjacent to a control-targeted control area via said sense amplifier in the direction of extension of said bit line.

4. The semiconductor memory device according to claim 1, wherein said each bit-line control signal generator circuit is arranged at one end of said memory cell array in the direction of extension of said bit line.

5. The semiconductor memory device according to claim 1, wherein said each bit-line control signal generator circuit is arranged at both ends of said memory cell array in the direction of extension of said bit line.

6. The semiconductor memory device according to claim 1, wherein said each bit-line control signal generator circuit is operative to elevate the output voltage of the bit-line control signal in proportion to the rise of the voltage on said cell source line.

7. The semiconductor memory device according to claim 1, said bit-line control signal generator circuit including
a resistor having one end supplied with the voltage on said cell source line and the other end serving as the output end of the bit-line control signal, and
a first constant current circuit operative to supply constant current flowing in said resistor.

8. The semiconductor memory device according to claim 7, further comprising a control signal generator circuit operative to supply a control signal for constant current control to said first constant current circuit,
wherein said control signal generator circuit supplies said control signal to said plurality of bit-line control signal generator circuits in common.

9. The semiconductor memory device according to claim 8, said control signal generator circuit including a second constant current circuit paired with said first constant current circuit in said bit-line control signal generator circuit to configure a current mirror.

10. The semiconductor memory device according to claim 1, said sense amplifier including
an initial charging circuit operative to supply the initial charging current from the power source to said bit line and a sense node and containing a bit line clamp transistor having a gate supplied with said bit line control signal to control the charging voltage given to said bit line,
a sensing capacitor connected to said sense node,
a current discriminating circuit operative to detect the value of current flowing in said bit line based on the potential on said sense node,
a latch operative to hold an output from said current discriminating circuit as read data, a discharging circuit connected to said initial charging circuit and operative to discharge the charge stored on said bit line and said sense node, and
a bit-line selection transistor operative to selectively connect a point of connection between said initial charging circuit and said discharging circuit with said bit line.

11. The semiconductor memory device according to claim 10, said initial charging circuit including
a first transistor operative to supply the initial charging current to said sense node,
a second transistor operative to supply current from said sense node to said bit line,
a third transistor for continuous current supplying operative to supply current to said bit line not via said sense node, and
a fourth transistor for voltage clamp connected between said second and third transistors and said bit line,
wherein said initial charging circuit turns said first transistor off and said third transistor on while said current discriminating circuit detects the potential on said sense node.

12. A semiconductor memory device, comprising:
a memory cell array having plural memory cells connected between a bit line and a cell source line;
a sense amplifier of the current sense type operative to initially charge said bit line with a charging voltage controlled by a bit-line control signal and detect the value of current flowing in said bit line when a certain gate voltage is given to a data read-targeted memory cell to decide data read out of said memory cell; and
a bit-line control signal generator circuit operative to receive the voltage on said cell source line, generate said bit-line control signal in accordance with the received voltage on said cell source line and provide it to said sense amplifier,
wherein said memory cell array and said sense amplifier are divided into M areas (M is an integer of 3 or more),
wherein said bit-line control signal generator circuit receives the voltage on said cell source line in each of said M areas of said memory cells, generates said bit-line control signal in accordance with the received voltage on said cell source line in each area, and supplies said generated bit-line control signal to said sense amplifier in each area.

13. The semiconductor memory device according to claim 12, wherein said bit-line control signal generator circuit is one of such bit-line control signal generator circuits provided N (N is an integer of 3 or more).

14. The semiconductor memory device according to claim 12, wherein said each bit-line control signal generator circuit is operative to elevate the output voltage of the bit-line control signal in proportion to the rise of the voltage on said cell source line.

15. The semiconductor memory device according to claim 12, said bit-line control signal generator circuit including
a resistor element having one end supplied with the voltage on said cell source line and the other end used as the output end of the bit-line control signal, and
a first constant current circuit operative to supply constant current flowing in said resistor element.

16. The semiconductor memory device according to claim 15,
wherein said bit-line control signal generator circuit is one of plural bit-line control signal generator circuits and said semiconductor memory device further comprising a control signal generator circuit operative to supply a control signal for constant current control to said first constant current circuit, wherein said control signal generator circuit supplies said control signal to said plurality of bit-line control signal generator circuits in common.

17. The semiconductor memory device according to claim 16, said control signal generator circuit including a second constant current circuit paired with said first constant current circuit in said bit-line control signal generator circuit to configure a current mirror.

18. The semiconductor memory device according to claim 12, said sense amplifier including an initial charging circuit operative to supply the initial charging current from the power source to said bit line and a sense node and containing a bit line clamp transistor having a gate supplied with said bit line control signal to control the charging voltage given to said bit line, a sensing capacitor connected to said sense node, a current discriminating circuit operative to detect the value of current flowing in said bit line based on the potential on said sense node, a latch operative to hold an output from said current discriminating circuit as read data, a discharging circuit connected to said initial charging circuit and operative to discharge the charge stored on said bit line and said sense node, and a bit-line selection transistor operative to selectively connect a point of connection between said initial charging circuit and said discharging circuit with said bit line.

19. The semiconductor memory device according to claim 18, said initial charging circuit including a first transistor operative to supply the initial charging current to said sense node, a second transistor operative to supply current from said sense node to said bit line, a third transistor for continuous current supplying operative to supply current to said bit line not via said sense node, and a fourth transistor for voltage clamp connected between said second and third transistors and said bit line, wherein said initial charging circuit turns said first transistor off and said third transistor on while said current discriminating circuit detects the potential on said sense node.

20. The semiconductor memory device according to claim 12, said memory cells form any one of a NAND-type flash memory, a NOR-type EEPROM, a DINOR-type EEPROM and an AND-type EEPROM.

* * * * *